(12) United States Patent
Vernon

(10) Patent No.: US 10,503,149 B2
(45) Date of Patent: Dec. 10, 2019

(54) SYSTEM, METHOD, AND COMPUTER PROGRAM FOR CREATING UNITED CELLULAR LATTICE STRUCTURE

(71) Applicant: Honeywell Federal Manufacturing & Technologies, LLC, Kansas City, MO (US)

(72) Inventor: Gregory John Vernon, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 526 days.

(21) Appl. No.: 15/282,099

(22) Filed: Sep. 30, 2016

(65) Prior Publication Data

US 2018/0095448 A1 Apr. 5, 2018

(51) Int. Cl.
| | |
|---|---|
| *G06F 17/50* | (2006.01) |
| *G05B 19/4099* | (2006.01) |
| *B33Y 50/02* | (2015.01) |
| *B33Y 30/00* | (2015.01) |
| *B33Y 10/00* | (2015.01) |
| *B29C 64/386* | (2017.01) |

(52) U.S. Cl.
CPC ..... *G05B 19/4099* (2013.01); *G06F 17/5018* (2013.01); *B29C 64/386* (2017.08); *B33Y 10/00* (2014.12); *B33Y 30/00* (2014.12); *B33Y 50/02* (2014.12); *G05B 2219/35134* (2013.01); *G05B 2219/49023* (2013.01)

(58) Field of Classification Search
CPC ...... G05B 19/4099; G05B 2219/35134; G05B 2219/49023; B29C 64/386; G06F 17/5018; B33Y 30/00; B33Y 50/02; B33Y 10/00
See application file for complete search history.

(56) References Cited

U.S. PATENT DOCUMENTS

| | | | |
|---|---|---|---|
| 6,545,676 B1 | 4/2003 | Ryan | |
| 6,611,267 B2 | 8/2003 | Migdal | |
| 6,897,863 B2 | 5/2005 | Kindratenko | |
| 9,180,010 B2* | 11/2015 | Dong | A61F 2/28 |
| 9,463,598 B2* | 10/2016 | Rockhold | B29C 67/0088 |
| 9,646,411 B2* | 5/2017 | Lee | G06T 15/205 |

(Continued)

FOREIGN PATENT DOCUMENTS

EP 2647453 10/2013

*Primary Examiner* — Aniss Chad
(74) *Attorney, Agent, or Firm* — Hovey Williams LLP

(57) ABSTRACT

A method for generating a computer-based united cellular lattice structure includes dividing a part volume into a number of adjacent subvolumes each having a side combination corresponding to a number and orientation of adjoining sides and non-adjoining sides. A modified lattice cell may be generated from a base lattice cell for each side combination of the subvolumes such that each modified lattice cell has face surfaces on faces thereof corresponding to non-adjoining sides and does not have face surfaces on faces thereof corresponding to adjoining sides. Copies of the modified lattice cells may then be generated and inserted into corresponding subvolumes such that the faces of the modified lattice cell copies having face surfaces are positioned along non-adjoining sides of the subvolumes and faces of the modified lattice cell copies not having face surfaces are positioned along adjoining sides of the subvolumes.

20 Claims, 10 Drawing Sheets

(56) References Cited

U.S. PATENT DOCUMENTS

| | | | |
|---|---|---|---|
| 9,902,114 B2* | 2/2018 | Musuvathy | B29C 64/386 |
| 2016/0133049 A1* | 5/2016 | Hill | G06T 17/10 |
| | | | 700/98 |
| 2016/0209820 A1* | 7/2016 | Banadyga | G05B 19/4099 |
| 2016/0236417 A1* | 8/2016 | Rothenberg | G05B 19/4099 |
| 2017/0228474 A1* | 8/2017 | Benjamin | G06F 17/50 |
| 2018/0009168 A1* | 1/2018 | Morovic | H04N 1/405 |

* cited by examiner

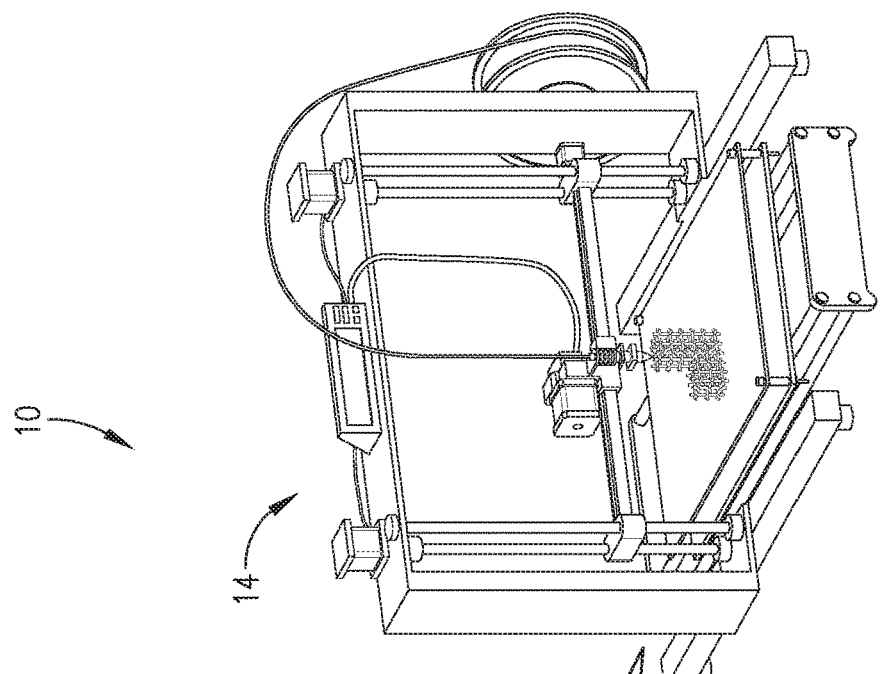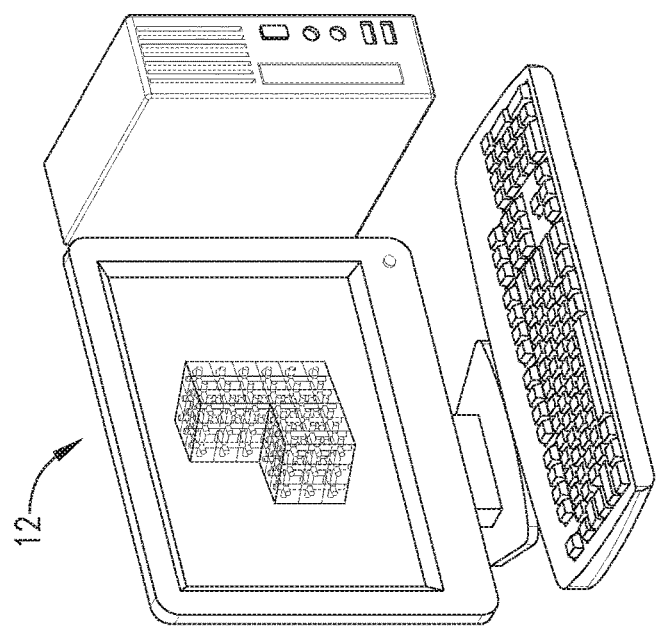
FIG. 1

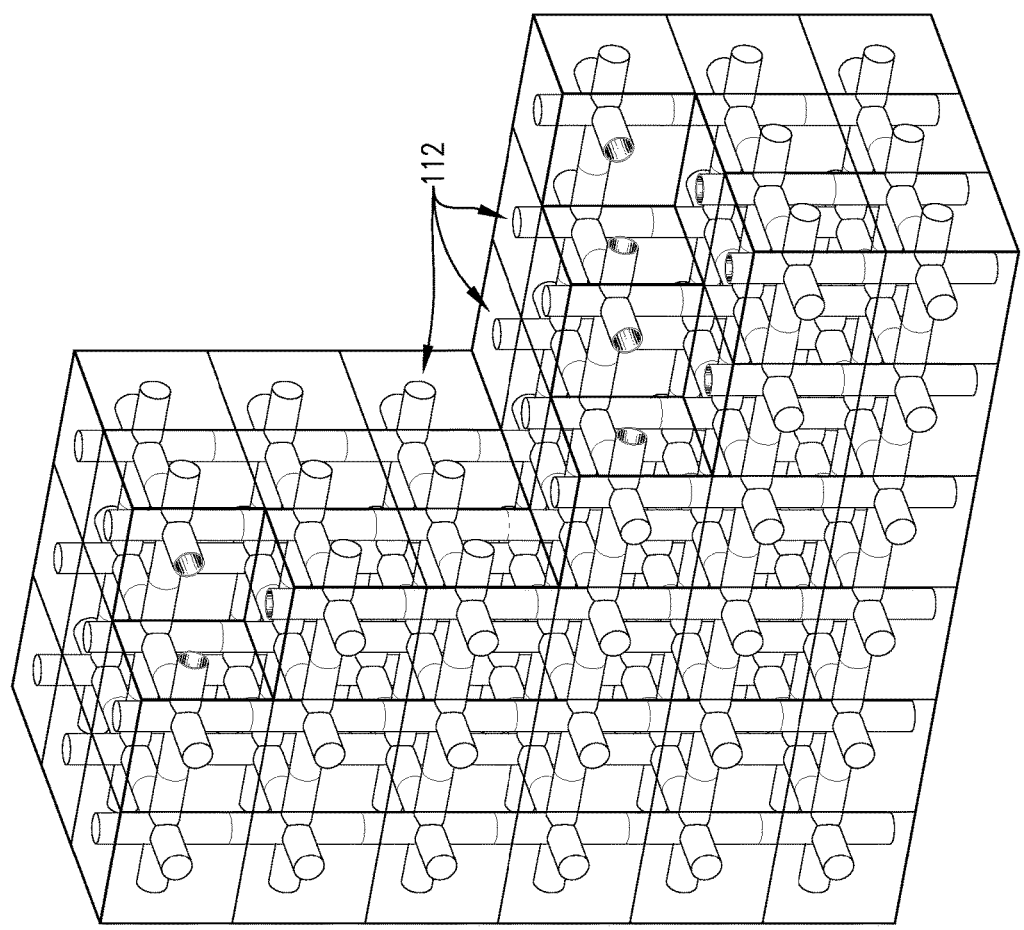

| Local Node Number | Global Node Numbers | | | |
|---|---|---|---|---|
| | Element 1 | Element 2 | Element 3 | Element 4 |
| 1 | 1 | 9 | 17 | 2 |
| 2 | 2 | 10 | 18 | 13 |
| 3 | 3 | 2 | 19 | 14 |
| 4 | 4 | 1 | 20 | 3 |
| 5 | 5 | 11 | 2 | 15 |
| 6 | 6 | 12 | 1 | 5 |
| 7 | 7 | 6 | 4 | 8 |
| 8 | 8 | 5 | 3 | 16 |

| Plane | Face Number | Local Node Numbers |
|---|---|---|
| X- | 1 | 3 8 7 4 |
| X+ | 2 | 1 6 5 2 |
| Y- | 3 | 1 4 7 6 |
| Y+ | 4 | 2 5 8 3 |
| Z- | 5 | 5 6 7 8 |
| Z+ | 6 | 1 2 3 4 |

SYSTEM, METHOD, AND COMPUTER PROGRAM FOR CREATING UNITED CELLULAR LATTICE STRUCTURE

STATEMENT REGARDING FEDERALLY-SPONSORED RESEARCH OR DEVELOPMENT

This invention was made with Government support under Contract No.: DE-NA00002839 awarded by the United States Department of Energy/National Nuclear Security Administration. The Government has certain rights in the invention.

BACKGROUND

Complex parts formed via additive manufacturing and similar techniques often incorporate united cellular lattice structures for reducing overall weight, increasing strength, and improving other properties of the parts. The united cellular lattice structures are modeled by merging together a large number of lattice cells. Each individual lattice cell includes a number of face surfaces that adjoin face surfaces of adjacent lattice cells. These adjoining face surfaces (i.e., "shared face surfaces") are not needed and thus are often removed when the lattice cells are merged together. Creating and removing the shared face surfaces is time intensive and significantly slows or delays computation of the united lattice cellular structures. It is also difficult to determine if all of the adjoining face surfaces have been removed properly, resulting in some adjoining face surfaces accidentally not being removed. This may result in computational or rendering errors or even additive manufacturing errors. For example, additive manufacturing material may be deposited incorrectly resulting in structural weaknesses, inadequate seals, weight imbalances, and other imperfections.

SUMMARY

Embodiments of the invention solve the above-mentioned problems and provide a distinct advance in the art of additive manufacturing systems and processes. More particularly, the invention provides a computer modeling and additive manufacturing system for creating a cellular lattice structure without searching for and removing shared or adjoining face surfaces of lattice cells of the cellular lattice structure.

An embodiment of the invention is a method of generating a computer-based united cellular lattice structure. The method includes dividing a part volume into a number of adjacent subvolumes. Each subvolume has a side combination corresponding to a number and orientation of adjoining sides and non-adjoining sides. A base lattice cell having face surfaces corresponding to a face of the base lattice cell may also be generated or received. A modified lattice cell may be generated from the base lattice cell for each side combination of the subvolumes such that each modified lattice cell has face surfaces on faces thereof for non-adjoining sides and does not have face surfaces on faces thereof for adjoining sides. Copies of the modified lattice cells may then be generated and inserted into corresponding subvolumes such that the faces of the modified lattice cell copies having face surfaces are positioned along non-adjoining sides of the subvolumes and the faces of the modified lattice cell copies not having face surfaces are positioned along adjoining sides of the subvolumes. In this way, the united cellular lattice structure may be created without computer processing intensive searching and removal of shared face surfaces. The chances of imperfections and errors being introduced into renderings of the united cellular lattice structure and/or the united cellular lattice structure itself are also significantly reduced.

Another embodiment of the invention is a method of creating a part according to a computer-based united cellular lattice structure via additive manufacturing. The computer-based united cellular lattice structure may be formed by dividing a part volume into a number of adjacent subvolumes each having a side combination corresponding to a number and orientation of adjoining sides and non-adjoining sides. A base lattice cell having face surfaces corresponding to a face of the base lattice cell may also be generated or received. A modified lattice cell may be generated from the base lattice cell for each side combination of the subvolumes such that each modified lattice cell has face surfaces on faces thereof for non-adjoining sides and does not have face surfaces on faces thereof for adjoining sides. Copies of the modified lattice cells may then be generated and inserted into corresponding subvolumes such that the faces of the modified lattice cell copies having face surfaces are positioned along non-adjoining sides of the subvolumes and the faces of the modified lattice cell copies not having face surfaces are positioned along adjoining sides of the subvolumes. The modified lattice cells may then be joined or merged to form the united cellular lattice structure. The part may then be formed by depositing additive manufacturing material in successive layers according to the united cellular lattice structure.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 1 is a perspective view of a computer modeling and additive manufacturing system constructed in accordance with an embodiment of the present invention;

FIG. 8 is a perspective view of copies of modified base lattice cells positioned in the subvolumes of FIG. 5;

Figure 2:
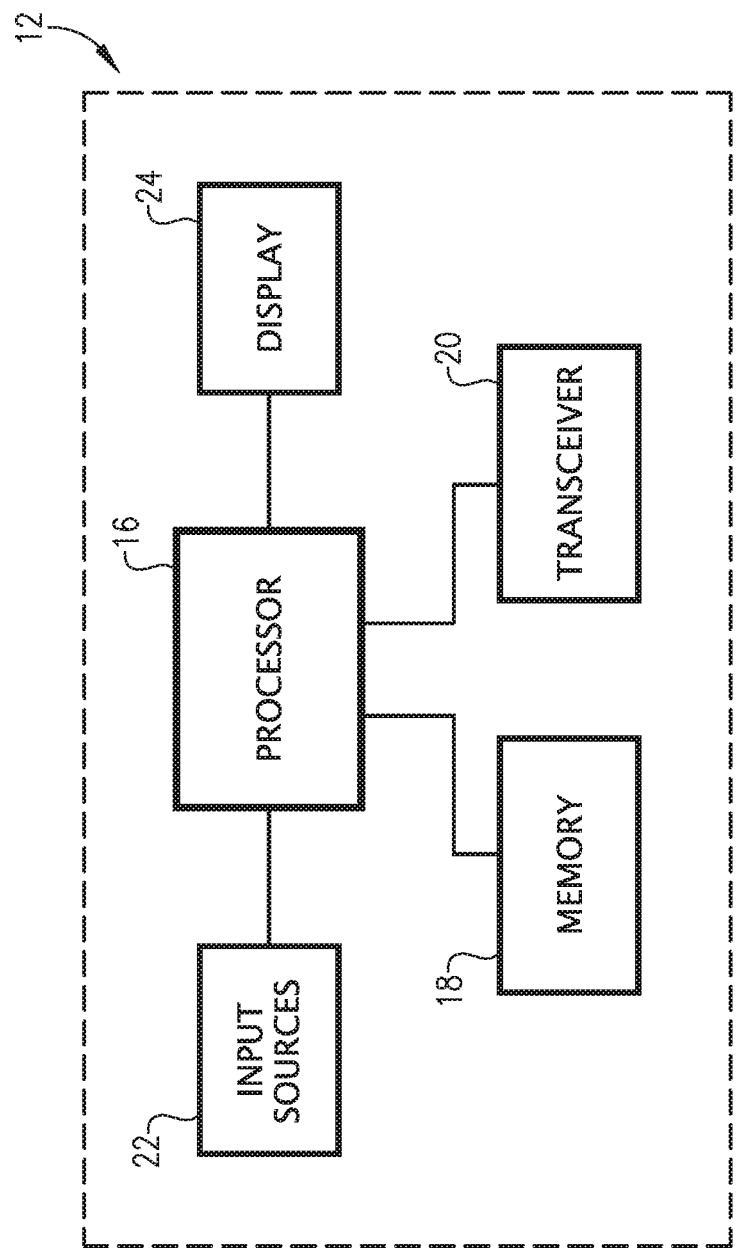
FIG. 2 is a block diagram of selected components of the computer modeling system of FIG. 1.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 3:
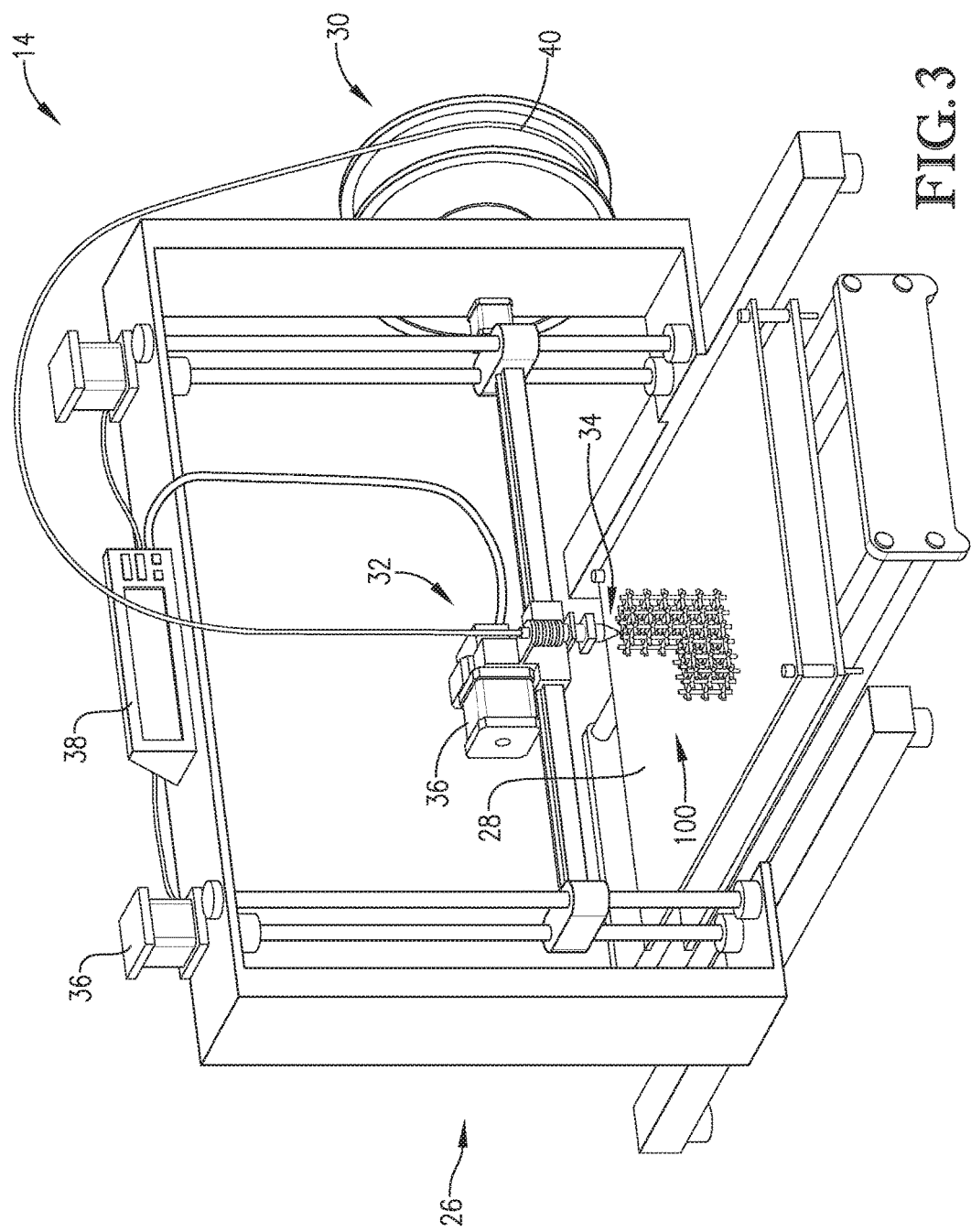
FIG. 3 is a perspective view of the additive manufacturing system of FIG. 1.
Figure 5:
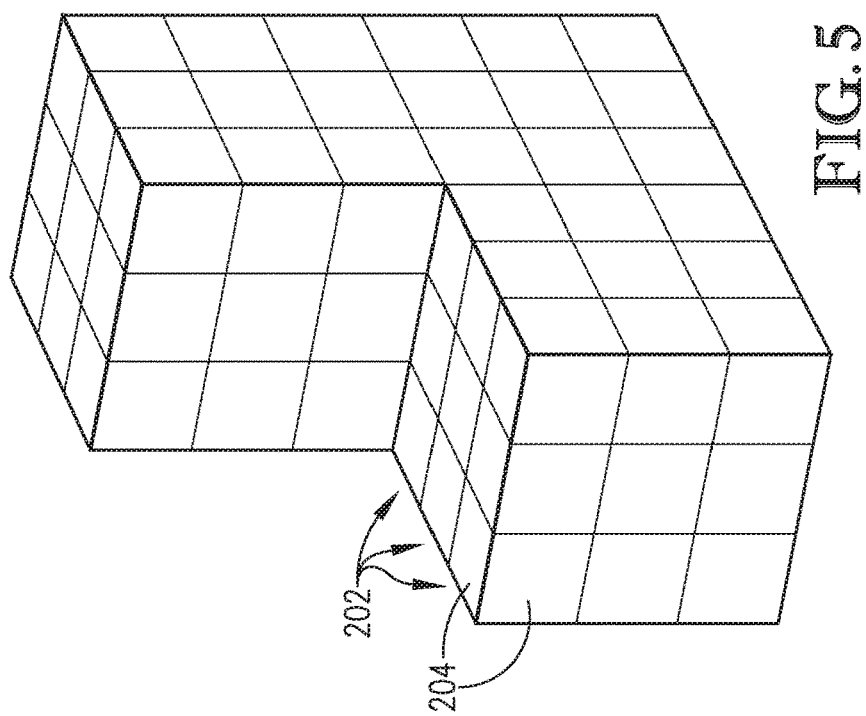
FIG. 5 is a perspective view of the part volume of FIG. 4 divided into subvolumes.
Figure 4:
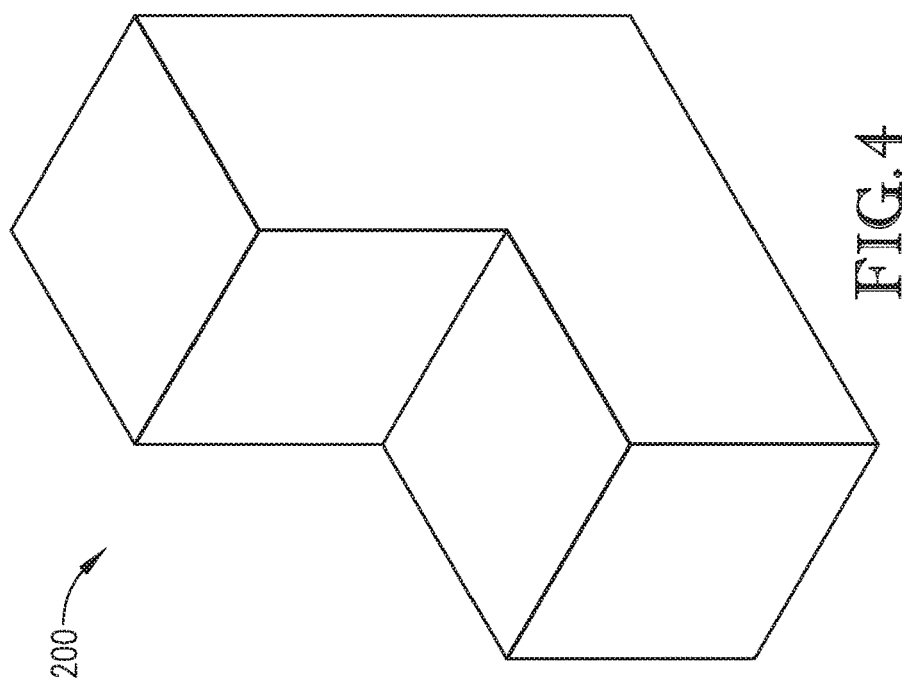
FIG. 4 is a perspective view of a part volume modeled via the computer modeling system of FIG. 1.
Figure 7:
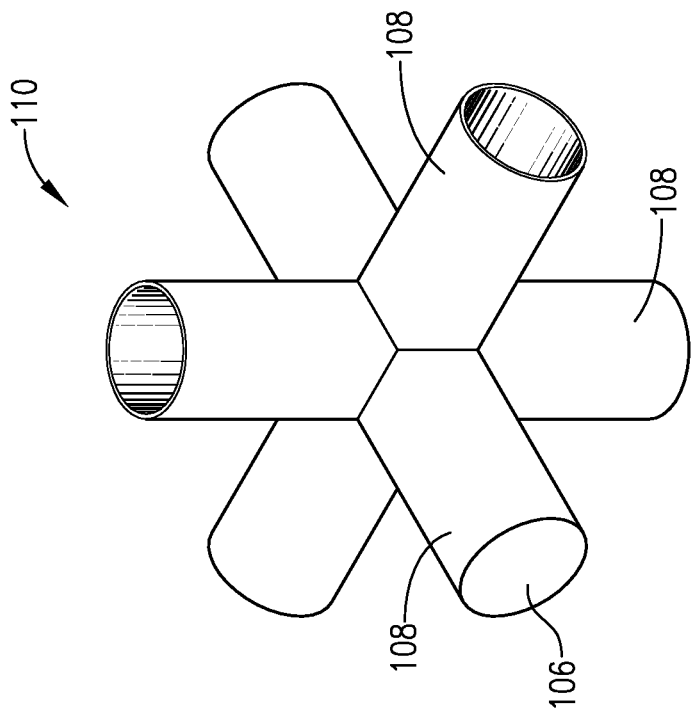
FIG. 7 is a perspective view of a modified base lattice cell including some of the face surfaces removed.
Figure 6:
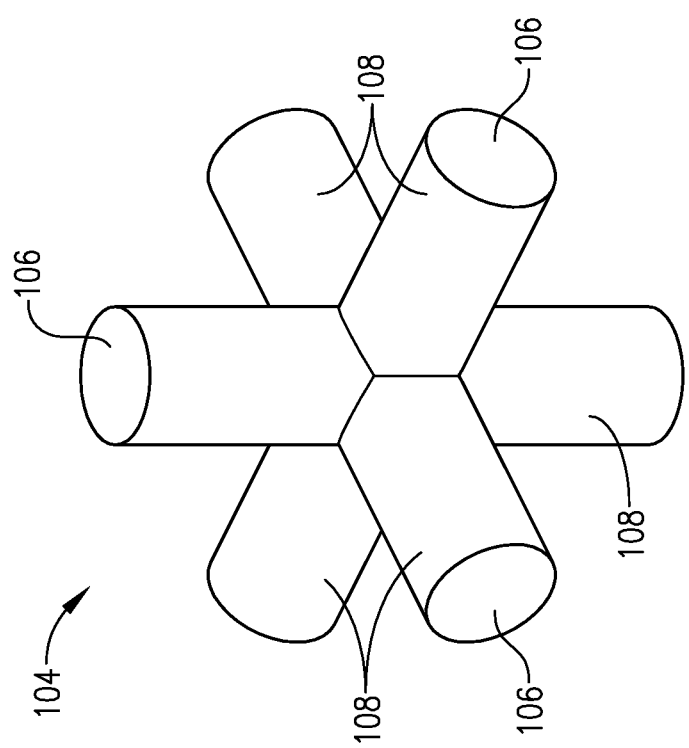
FIG. 6 is a perspective view of a base lattice cell including face surfaces.
Figure 9:
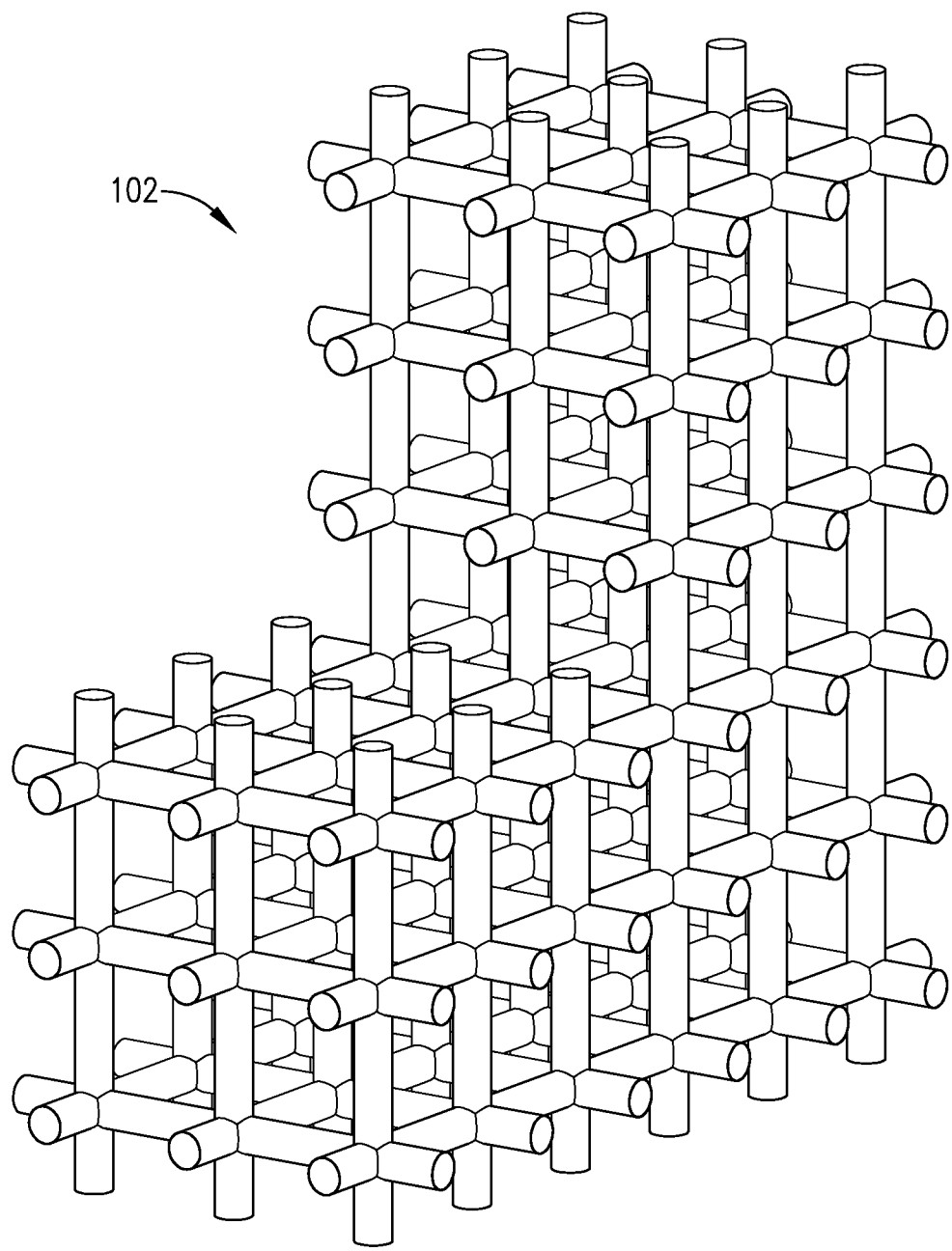
FIG. 9 is a perspective view of a united cellular lattice structure formed from the modified base lattice cell copies of FIG. 8.

Turning to the drawing figures, and particularly FIGS. 1-3, a computer modeling and additive manufacturing system 10 constructed in accordance with an embodiment of the present invention is illustrated. The computer modeling and additive manufacturing system 10 broadly comprises a computer aided design (CAD) system 12 and an additive manufacturing system 14.

The CAD system 12 may be used for designing and generating a computer model of a part 100 and broadly includes a processor 16, a memory 18, a transceiver 20, a plurality of inputs 22, and a display 24. The CAD system 12 may be integral with or separate from the additive manufacturing system 14.

The processor 16 generates data representative of the computer model of the part 100 according to inputs and data received from a user. The processor 16 may include a circuit board, memory, display, inputs, and/or other electronic components such as a transceiver or external connection for communicating with external computers and the like.

The processor 16 may implement aspects of the present invention with one or more computer programs stored in or on computer-readable medium residing on or accessible by the processor. Each computer program preferably comprises an ordered listing of executable instructions for implementing logical functions and generating and manipulating data representative of part models, part volumes, subvolumes, modeling frames, metadata, and other data in the processor 16. Each computer program can be embodied in any non-transitory computer-readable medium, such as the memory 18 (described below), for use by or in connection with an instruction execution system, apparatus, or device, such as a computer-based system, processor-containing system, or other system that can fetch the instructions from the instruction execution system, apparatus, or device, and execute the instructions.

The memory 18 may be any computer-readable non-transitory medium that can store the program for use by or in connection with the instruction execution system, apparatus, or device. The computer-readable medium can be, for example, but not limited to, an electronic, magnetic, optical, electro-magnetic, infrared, or semi-conductor system, apparatus, or device. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

The transceiver 20 may transmit data and instructions between the CAD system 12 and the additive manufacturing system 14. Alternatively, a wired or integrated setup may be used between the CAD system 12 and the additive manufacturing system 14.

The inputs 22 allow a user to design and modify a model of the part 100 and may comprise a keyboard, mouse, trackball, touchscreen, buttons, dials, virtual inputs, and/or a virtual reality simulator. The inputs 22 may also be used to control or instruct the additive manufacturing system 14.

The display 24 may display a two-dimensional or three-dimensional representation of the model and may also display model data, computer options, and other information via a graphical user interface (GUI). The display 24 may be separate from or integrated with the additive manufacturing system 14.

The additive manufacturing system 14 produces prototypes and parts such as part 100 and broadly comprises a frame 26, a support surface 28, a material reserve 30, a feeder 32, a material applicator 34, a set of motors 36, and a processor 38. The additive manufacturing system 14 may be integral with or separate from the computer aided design system 12.

The frame 26 provides structure for the support surface 28, material reserve 30, feeder 32, material applicator 34, motors 36, and/or the processor 38 and may include a base, vertical members, cross members, and mounting points for mounting the above components thereto. Alternatively, the frame 26 may be a walled housing or similar structure.

The support surface 28 supports the part 100 as it is being constructed and may be a stationary or movable flat tray or bed, a substrate, a mandrel, a wheel, scaffolding, or similar support. The support surface 28 may be integral with the additive manufacturing system 14 or may be removable and transferable with the part 100 as the part 100 is being constructed.

The material reserve 30 retains additive manufacturing material 40 and may be a hopper, tank, cartridge, container, spool, or other similar material holder. The material reserve may be integral with the additive manufacturing system 14 or may be disposable and/or reusable.

The additive manufacturing material 40 may be used for forming part 100 and may be in pellet or powder form, filament or spooled form, or any other suitable form. The additive manufacturing material 40 may be any plastic, polymer, or organic material suitable for use in additive manufacturing. For example, the additive manufacturing material 40 may be acrylonitrile butadiene styrene (ABS), polyamide, straw-based plastic, or other similar material.

The feeder 32 directs the additive manufacturing material 40 to the material applicator 34 and may be a spool feeder, a pump, an auger, or any other suitable feeder. Alternatively, the additive manufacturing material 40 may be gravity fed to the material applicator 34.

The material applicator 34 deposits the additive manufacturing material 40 onto the support surface 28 and previously constructed layers. The material applicator 34 may include a nozzle, guide, sprayer, or other similar component for channeling the additive manufacturing material 40 and a laser, heater, or similar component for melting the additive manufacturing material and bonding (e.g., sintering) the additive manufacturing material onto a previously constructed layer. The material applicator 34 may be sized according to the size of the pellets, powder, or filament being deposited.

The motors 36 position the material applicator 34 over the support surface 28 and previously constructed layers and move the material applicator 34 as the additive manufacturing material is deposited onto the support surface 28 and the previously constructed layers. The motors 36 may be oriented orthogonally to each other so that a first one of the motors 36 is configured to move the material applicator 34 in a lateral "x" direction, a second one of the motors 36 is configured to move the material applicator 34 in a longitudinal "y" direction, and a third one of the motors 36 is configured to move the material applicator 34 in an altitudinal "z" direction. Alternatively, the motors 36 may move the support surface 28 (and hence the part 100) while the material applicator 34 remains stationary.

The processor 38 directs the material applicator 34 via the motors 36 and activates the material applicator 34 such that the material applicator 34 deposits the additive manufacturing material 40 onto the support surface 28 and previously constructed layers according to a computer aided design of the part. The processor 38 may include a circuit board, memory, display, inputs, and/or other electronic components such as a transceiver or external connection for communicating with the processor 16 of the CAD system 12 and other external computers. It will be understood that the processor 38 may be one and the same as processor 16 of the CAD system 12.

The processor 38 may implement aspects of the present invention with one or more computer programs stored in or on computer-readable medium residing on or accessible by the processor. Each computer program preferably comprises an ordered listing of executable instructions for implementing logical functions in the processor 38. Each computer program can be embodied in any non-transitory computer-readable medium for use by or in connection with an instruction execution system, apparatus, or device, such as a computer-based system, processor-containing system, or other system that can fetch the instructions from the instruction execution system, apparatus, or device, and execute the instructions. In the context of this application, a "computer-readable medium" can be any non-transitory means that can store the program for use by or in connection with the instruction execution system, apparatus, or device. The computer-readable medium can be, for example, but not limited to, an electronic, magnetic, optical, electro-magnetic, infrared, or semi-conductor system, apparatus, or device. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

It will be understood that the additive manufacturing system 14 may be any type of additive manufacturing or "3D printing" system such as a sintering, laser melting, laser sintering, extruding, fusing, stereolithography, extrusion, light polymerizing, powder bed, wire additive, or laminated object manufacturing system. The additive manufacturing system 14 may also be a hybrid system that combines additive manufacturing with molding, scaffolding, and/or other subtractive manufacturing or assembly techniques.

Figure 10:
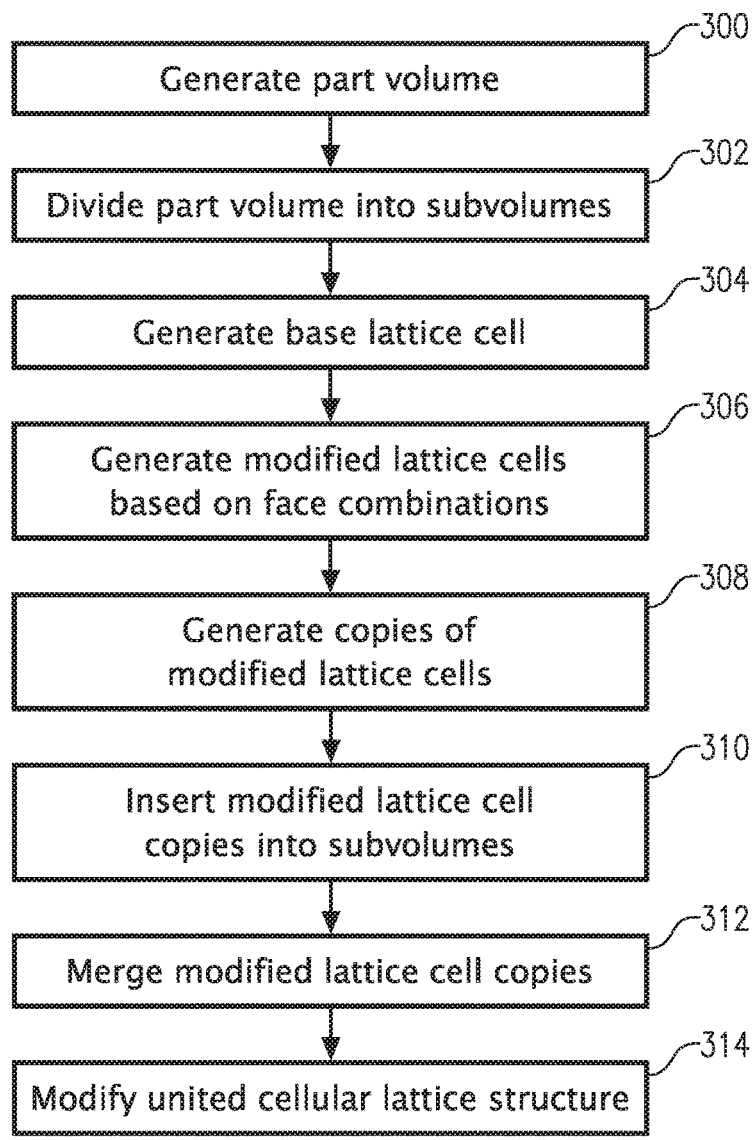
FIG. 10 is a flow diagram of a method of creating a united cellular lattice structure in accordance with another embodiment of the invention.
Figure 11:
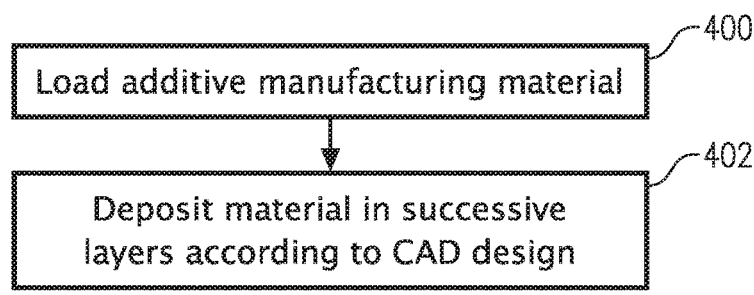
FIG. 11 is a flow diagram of a method of forming a united cellular lattice structure in accordance with another embodiment of the invention.

Turning to FIGS. 10 and 11, and with reference to FIGS. 4-9, use of the computer modeling and additive manufacturing system 10 for creating a computer model and united cellular lattice structure 102 of the part 100 and forming the part 100 via additive manufacturing according to the computer model will now be described in more detail. First, a computer-aided design of a part volume 200 may be received or generated, in which an overall shape of the part volume 200 may be created, as shown in block 300 of FIG. 10. This may be data representative of a wire-frame model, surface model, solid model, or any other suitable CAD model that defines or exhibits the overall shape of the part volume 200.

The part volume 200 may be divided into a plurality of subvolumes 202, as shown in block 302. The subvolumes 202 each have a number of sides 204, each side 204 either adjoining or not adjoining a side of an adjacent subvolume 202. That is, some sides of the subvolumes 202 are "internal" sides (adjoining sides) while some sides of the subvolumes 202 are "external sides" (non-adjoining sides) such that the internal sides are positioned within the part volume 200 and the external sides coincide with portions of a side of the part volume 200. The subvolumes 202 may take any suitable shape such as triagonal, quadrilateral, tetrahedral, pyramidal, hexahedral, dodecahedral, or any other parameterizable polyhedral subvolume shapes.

The subvolumes 202 each have a side combination corresponding to a number and orientation of subvolumes adjacent thereto. Said another way, the side combinations correspond to a number and orientation of adjoining sides and non-adjoining sides. For example, a hexahedral subvolume has sixty-four unique possible side combinations. A subvolume positioned in a center of the volume would have six adjoining sides and no non-adjoining sides. A subvolume positioned on a corner of the volume would have three adjoining sides next to each other and three non-adjoining sides next to each other.

Data representative of a base lattice cell 104 may then be received or generated, as shown in block 304. The base lattice cell 104 may be a repeatable structural unit for populating a lattice structure (described below) and may itself be a wire-frame model, surface model, solid model, finite element surface or mesh (e.g., isoparametric or isogeometric finite elements), face-node connectivity polygonal surface, unique polygonal surface, or any other suitable CAD model. The base lattice cell 104 may have a shape that at least partially coincides with the shape of the subvolumes. For example, if the subvolumes are hexahedral, the base lattice cell 104 may also be hexahedral. The base lattice cell 104 may have a plurality of surfaces. Each surface of the base lattice cell 104 may be categorized as either a face surface 106 or an inner surface 108. The face surfaces 106 correspond to faces of the base lattice cell 104 while the inner surfaces 108 do not correspond to faces of the base lattice cell 104. The base lattice cell 104 may have any shape and may include truss members, cross members, frame-like members, or any other structural components and may have chamfers, fillets, recesses, arches, and complex curves. The base lattice cell 104 may also include through-holes, channels, voids, chambers, and other negative spaces for allowing fluid to flow therethrough. For example, the base lattice cell 104 may have extruded and non-extruded honeycomb, square, tube, hexahedral, toroidial, or scaffold shapes, or any other suitable shape. The base lattice cell 104 may also include meta-data defining surface classes and other suitable information.

Data representative of modified lattice cells 110 may then be generated from the base lattice cell 104 for each unique side combination of the subvolumes, as shown in block 306. That is, face surfaces corresponding to adjoining sides of the side combination are removed and face surfaces corresponding to non-adjoining sides of the side combination are not removed. It will be understood that the base lattice cell 104 may be formed without face surfaces such that the modified lattice cells 110 are generated by adding face surfaces corresponding to non-adjoining sides of the side combination and not adding face surfaces corresponding to adjoining sides of the side combination. An exemplary calculation of the unique side combinations will be described below.

Data representative of modified lattice cell copies 112 (shown inserted into the subvolumes in FIG. 8) may then be generated according to the number of subvolumes having each side combination, as shown in block 308. As an example, a cubic volume having twenty-seven subvolumes (similar in appearance to a Rubik's® cube) would require a modified lattice cell copy with zero face surfaces (i.e., the central subvolume), six modified lattice cell copies with one face surface (i.e., the side subvolumes), twelve modified lattice cell copies with two adjacent surfaces (i.e., the edge subvolumes), and six modified lattice cell copies with three adjacent face surfaces (i.e., the corner subvolumes).

The modified lattice cell copies 112 may then be inserted into the corresponding subvolumes such that the faces of the modified lattice cell copies 112 having face surfaces are positioned along non-adjoining sides of the subvolumes 202, as shown in block 310. The faces of the modified lattice cell copies 112 not having face surfaces are positioned along adjoining sides of the subvolumes 202.

The modified lattice cell copies 112 may then be merged or joined to form the united cellular lattice structure 102, as shown in block 312. The united cellular lattice structure 102 can then be used to form the part 100 as described in more detail below.

Portions of the united cellular lattice structure 102 may be modified to conform to the shape of the part or to design changes, as shown in block 314. To that end, portions of the united cellular lattice structure 102 may undergo smoothing, Jacobian optimization, Laplace optimization, regularity optimization, or other deformations either directly or via manipulation of the subvolumes 202. The united cellular lattice structure 102 and/or the subvolumes 202 may also be manually deformed or edited. Portions of the united cellular lattice structure 102 may be removed or replaced and new sections may be added. Some modified lattice cell copies may need to be replaced with modified lattice cell copies corresponding to different subvolume side combinations.

The above-described steps may be performed substantially in any order without departing from the scope of the invention. For example, some steps may be reordered or performed essentially simultaneously. Furthermore, formation of the part volume 200, subvolumes 202, base lattice cell 104, modified lattice cells 110, modified lattice cell copies 112, united cellular lattice structure 102 may be performed in pre-processing, runtime processing, or post-processing phases. For example, the base lattice cell 104 and the modified lattice cells 110 may be pre-processed such that only non-duplicate face surfaces are inserted into the subvolumes 202. The base lattice cell 104 and modified lattice cells 110 may also be pre-formed and stored a lattice cell database such that the base lattice cell 104 and/or modified lattice cells 110 are selected for use in the creation of the united cellular lattice structure 102. This may reduce or eliminate the need for recreating design elements.

The united cellular lattice structure 102 and hence the part 100 may then be formed via the additive manufacturing system 14, as shown in FIG. 11. First, the additive manufacturing material may be inserted in or positioned on the material reserve 30 of the additive manufacturing system 14, as shown in block 400. For example, a spool of the additive manufacturing material 40 may be loaded onto the additive manufacturing system 14.

The additive manufacturing material 40 may then be deposited onto the support surface 28 via the material applicator 34 in successive layers according to the computer-aided design of the united cellular lattice structure 102, as shown in block 402. To that end, activation of horizontally oriented motors in various amounts allows for diagonal movement and curved movement of the material applicator 34. Activation of a vertically oriented motor may be used for relocating the material applicator 34 without depositing material and/or raising the material applicator 34 for creation of a new layer (see motors 36, above).

It will be understood that the above-described steps may be performed in any order, including simultaneously. In addition, some of the steps may be repeated, duplicated, and/or omitted without departing from the scope of the present invention.

Figure 12:
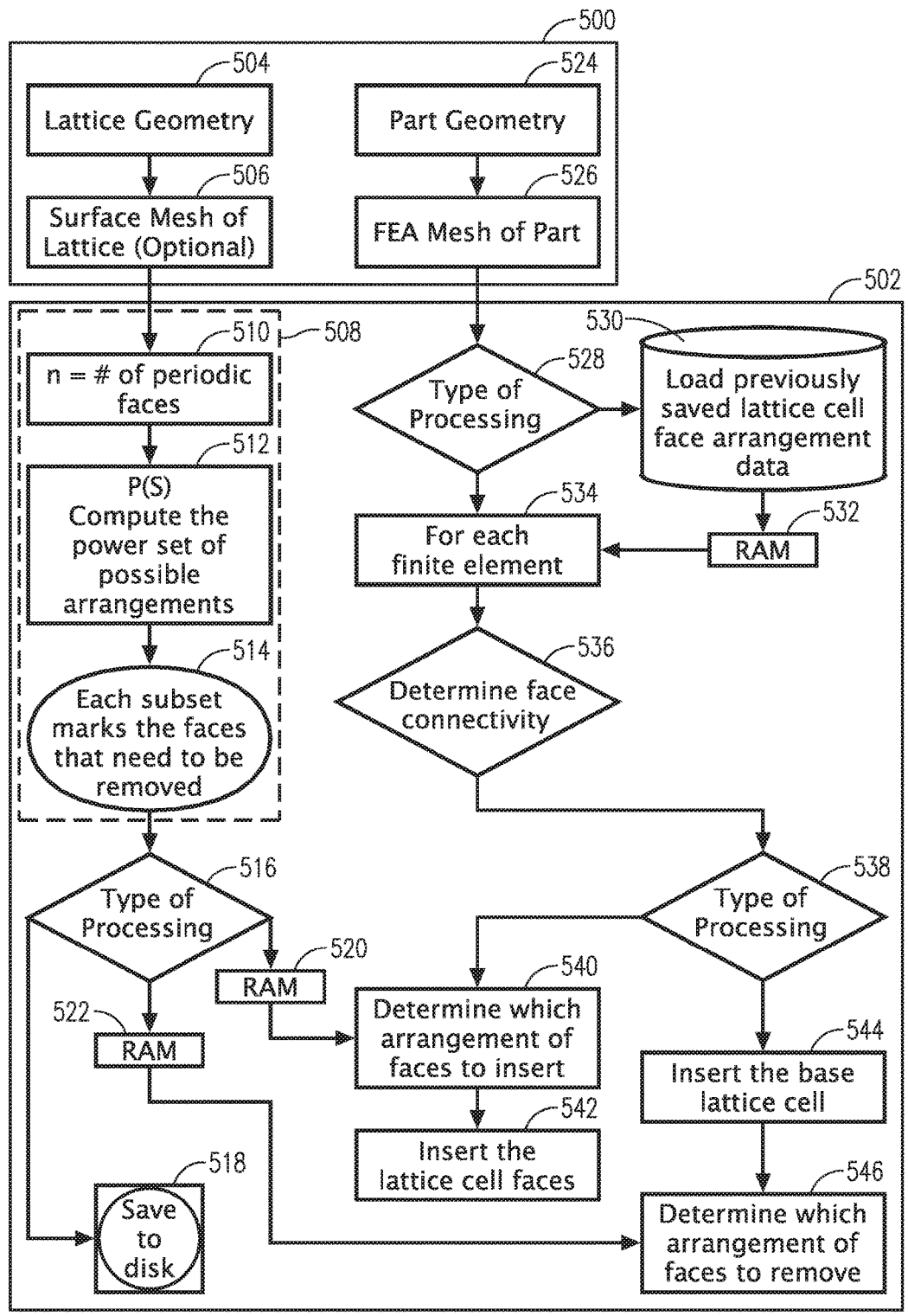
FIG. 12 is a flow diagram of a method of forming a united cellular lattice structure in accordance with another embodiment of the invention.

With reference to FIG. 12, an exemplary computation and generation of lattice geometry and part geometry will now be shown. Each step may take place during a design phase 500 or a cell insertion phase 502. First, lattice geometry may be received or generated, as shown in block 504. A surface mesh of the lattice geometry may optionally be created for the lattice geometry, as shown in block 506.

Unique lattice cell face arrangements may then be determined, as shown in block 508. First, n number of periodic faces is determined, as shown in block 510. For example, tetrahedrons have four faces, wedges and pyramids have five faces, and hexahedrons have six faces. These faces form a set S. There are $|S|=n$ elements in the set. A power set $P(S)$ can then be defined and computed, as shown in block 512. There are $|P(S)|=2^n$ subsets of S. As an example, the four faces of a tetrahedron can be numbered 1 to 4. These faces form the set S={1, 2, 3, 4}. Note that there are $|S|=4$ elements in the set. The power set of S is P(S)={{ }, {1}, {2}, {3}, {4}, {1, 2}, {1, 3}, {1, 4}, {2, 3}, {2, 4}, {3, 4}, {1, 2, 3}, {1, 2, 4}, {1, 3, 4}, {2, 3, 4}, {1, 2, 3, 4}}. Note also that there are $|P(S)|=2^4=16$ subsets of S. A power set for a hexahedron would have $|P(S)|=2^6=64$ subsets. Each subset marks the faces to be removed for one of the unique lattice cell face arrangements, as shown in block 514.

The lattice geometry, surface mesh, and/or unique lattice cell face arrangements may then be used or stored according to a type of processing selected, as shown in block 516. If pre-processing is used, the lattice geometry, surface mesh, and/or unique lattice cell face arrangements may be saved for later use, as shown in block 518. If runtime processing or post-processing is used, the lattice geometry, surface mesh, and/or unique lattice cell face arrangements is placed in RAM or otherwise made readily available for use by the processor 16.

Meanwhile, a part geometry and a mesh of the part may be generated or received, as shown in blocks 524 and 526. This may be performed along with blocks 504 and 506, described above.

Depending on whether pre-processing, runtime processing, or post-processing is used (block 528), the previously saved lattice cell face arrangements may be loaded into RAM, as shown in blocks 530 and 532. For each finite element, face connectivity is then determined, as shown in blocks 534 and 536.

If pre-processing or runtime processing is used, the proper arrangement of face surfaces to insert into the part mesh is determined, as shown in blocks 538 and 540. Importantly, the nodes of the part mesh are unique nodes. An example of this determination will be described in more detail below. Note that the unique lattice cell face arrangements can be accessed from RAM or other computer memory (block 520 described above). The proper lattice cell faces may then be inserted into the part mesh, as shown in block 542.

If post-processing is used, the base lattice cells may be inserted into the part mesh, as shown in blocks 538 and 544. The internal face surfaces may then be removed, as shown in block 546. Determination of which face surfaces are internal will be described in more detail below. Note that the unique lattice cell face arrangements can be accessed from RAM or other computer memory (block 522 described above).

Figures 13, 14, 15:
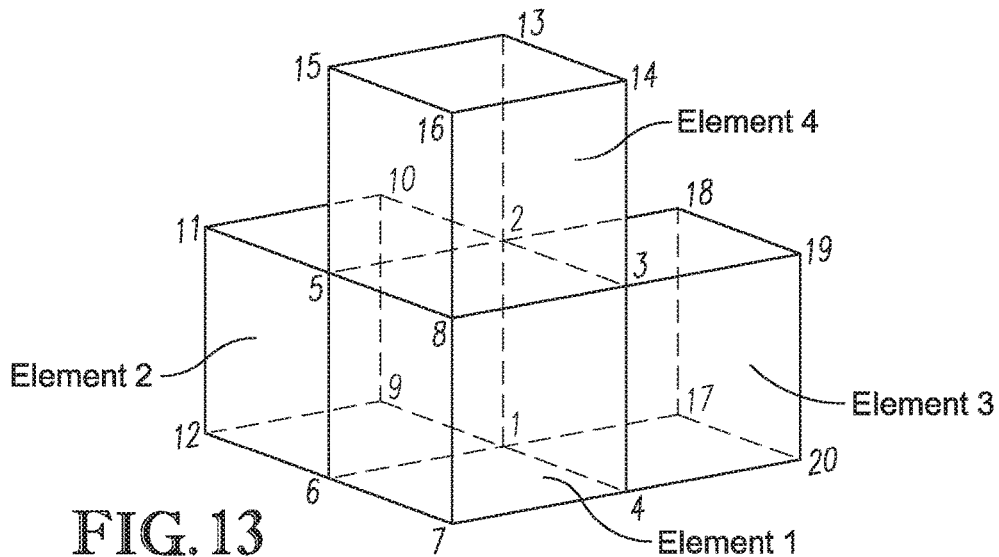
FIG. 13 is a perspective view of finite elements modeled via the computer modeling system of FIG. 1.
FIG. 14 is a chart of global and local node numbers for the finite elements of FIG. 13.
FIG. 15 is a chart of local node numbers, face numbers, and planes associated with faces of the finite elements of FIG. 13.

With reference to FIGS. 13-15, an example of determination of internal face surfaces (i.e., "shared face surfaces") will now be described in more detail. This example utilizes eight-node hexahedral finite elements. Each node is assigned a global node number 1 through 20.

A first finite element (the corner element in FIG. 13) can be evaluated to determine which of its face surfaces are shared with a face surface of another finite element. To achieve this, the nodes of the first finite element are analyzed to determine which of them correspond to another finite element. The nodes of the first finite element may be assigned local node numbers 1 through 8. The faces of the first finite element may also be assigned a face number 1 through 8 and a plane X−, X+, Y−, Y+, Z−, and Z+. The faces of the first finite element are also associated with four of the local node numbers. For example, face number 1 is associated with local node numbers 3, 8, 7, and 4 and plane X−.

The global node numbers of the first finite element may be compared with the global node numbers of the other finite elements to determine which global node numbers are associated with other finite elements. In this example, global node numbers 1 through 6 and 8 are associated with other finite elements. It does not matter with which other finite element the global node numbers are associated. It only matters that these global node numbers are associated with another finite element. A local node number corresponding to each shared global node number is then extracted. For the first finite element, local node numbers 1-6 and 8 are associated with global node numbers 1-6 and 8. The faces of the first finite element in which all of the corresponding local node numbers correspond to shared global node numbers are shared faces. In this case, faces 2, 4, and 6 (corresponding to planes X+, Y+, and Z+) are shared. For example, face 2 is assigned local node numbers 1, 2, 5, and 6, which all correspond to shared global node numbers. Face 3 is assigned local node numbers 1, 4, 6, and 7. Because local node number 7 does not correspond to a shared global node number, face 3 is not a shared face. Note that all of the shared faces of the first finite element can be determined together instead of individually. This significantly improves analysis and hence computing efficiency. The remaining finite elements can then be evaluated in a similar manner to determine their shared faces.

The above-described face sharing determination can be performed for higher-order finite elements such as twenty-node hexahedrons. In this case, each face must have nine local node numbers that all correspond to shared global node numbers in order to be considered a shared face. The above face sharing determination can be performed for 1st order or higher finite elements and can be used where the finite elements are deformed or otherwise modified.

The above-described computer modeling and additive manufacturing system 10 and method provide several advantages over conventional systems. For example, the united cellular lattice structure 102 may be generated without time intensive "search and destroy" removal of shared internal face surfaces. Validity of the cellular lattice structure 102 may easily be verified via side combination metadata associated with the modified lattice cell copies and the corresponding subvolumes. The united cellular lattice structure 102 may also easily be modified by replacing modified lattice cell copies associated with one face combination with modified lattice cell copies associated with different face combinations.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method of generating a computer-based united cellular lattice structure comprising the steps of:
   receiving data representative of a plurality of subvolumes formed from a part volume, each subvolume having a plurality of sides such that the subvolume is configured to be positioned adjacent to at least one other subvolume, the plurality of sides including at least one of an adjoining side and a non-adjoining side, the subvolume having a side combination corresponding to a number and orientation of adjoining sides and non-adjoining sides;
   receiving data representative of a base lattice cell having a plurality of surfaces, some of the surfaces being face surfaces corresponding to faces of the base lattice cell;
   generating data representative of a modified lattice cell from the base lattice cell for each side combination of the subvolumes such that each modified lattice cell has face surfaces on faces thereof corresponding to non-adjoining sides and does not have face surfaces on faces thereof corresponding to adjoining sides;

generating data representative of copies of the modified lattice cells; and inserting the copies of the modified lattice cells into corresponding subvolumes such that the faces of the modified lattice cell copies having face surfaces are positioned along non-adjoining sides of the subvolumes and the faces of the modified lattice cell copies not having face surfaces are positioned along adjoining sides of the subvolumes.

2. The method of claim 1, wherein the subvolume is hexahedral.

3. The method of claim 1, wherein the base lattice cell is generated during a pre-processing phase.

4. The method of claim 1, wherein the base lattice cell is generated during a runtime processing phase.

5. The method of claim 1, wherein the base lattice cell is generated during a post-processing phase.

6. The method of claim 1, wherein the step of generating the data representative of the modified lattice cells is performed substantially simultaneously with the steps of generating the data representative of the copies of the modified lattice cells and inserting the copies of the modified lattice cells into the corresponding subvolumes.

7. The method of claim 1, wherein the step of generating the data representative of the modified lattice cells is performed before the steps of generating data representative of the copies of the modified lattice cells and inserting the copies of the modified lattice cells into the corresponding subvolumes.

8. The method of claim 1, wherein the base lattice cell is a finite element surface.

9. The method of claim 1, wherein the base lattice cell is a finite element volume mesh.

10. The method of claim 1, wherein the base lattice cell is a face-node connectivity polygonal surface.

11. The method of claim 1, wherein the base lattice cell is a unique-polygonal surface.

12. The method of claim 1, wherein the base lattice cell includes meta-data defining surface classes.

13. The method of claim 1, wherein the step of receiving data representative of a part volume includes creating data representative of the part volume via a computer-aided design system.

14. The method of claim 1, wherein the step of receiving data representative of the base lattice cell includes creating data representative of the base lattice cell via a computer aided design system.

15. The method of claim 1, further comprising the step of modifying a shape of at least some of the subvolumes.

16. The method of claim 1, further comprising the step of modifying a shape of at least some of the copies of the modified lattice cells.

17. The method of claim 1, further comprising the step of replacing a copy of a modified lattice cell with a copy of another modified lattice cell.

18. The method of claim 1, further comprising a step of receiving data representative of a part volume, the step of receiving data representative of the plurality of subvolumes including decomposing the part volume into the plurality of subvolumes.

19. A method of generating a computer-based united cellular lattice structure comprising the steps of:
generating data representative of a part volume;
decomposing the part volume into a plurality of subvolumes, each subvolume having a plurality of sides such that the subvolume is configured to be positioned adjacent to at least one other subvolume, the plurality of sides including at least one of an adjoining side and a non-adjoining side, the subvolume having a side combination corresponding to a number and orientation of adjoining sides and non-adjoining sides;
generating data representative of a base lattice cell having a plurality of surfaces, some of the surfaces being face surfaces corresponding to faces of the base lattice cell, the base lattice cell being created during a pre-processing phase;
generating data representative of a modified lattice cell from the base lattice cell for each side combination of the subvolumes such that each modified lattice cell has face surfaces on faces thereof corresponding to non-adjoining sides and does not have face surfaces on faces thereof corresponding to adjoining sides, the modified lattice cells being generated during the pre-processing phase;
generating data representative of copies of the modified lattice cells, the modified lattice cell copies being generated during the pre-processing phase; and
inserting the copies of the modified lattice cells into corresponding subvolumes such that the faces of the modified lattice cell copies having face surfaces are positioned along non-adjoining sides of the subvolumes and the faces of the modified lattice cell copies not having face surfaces are positioned along adjoining sides of the subvolumes, modified lattice cell copies being inserted into the corresponding subvolumes during a processing phase.

20. A system for creating a part based on a united cellular lattice structure, the system comprising:
a computer modeling system comprising:
a processor configured to:
receive data representative of a plurality of subvolumes formed from a part volume, each subvolume having a plurality of sides such that the subvolume is configured to be positioned adjacent to at least one other subvolume, the plurality of sides including at least one of an adjoining side and a non-adjoining side, the subvolume having a side combination corresponding to a number and orientation of adjoining sides and non-adjoining sides;
receive data representative of a base lattice cell having a plurality of surfaces, some of the surfaces being face surfaces corresponding to faces of the base lattice cell;
generate data representative of a modified lattice cell from the base lattice cell for each side combination of the subvolumes such that each modified lattice cell has face surfaces on faces thereof corresponding to non-adjoining sides and does not have face surfaces on faces thereof corresponding to adjoining sides;
generate data representative of copies of the modified lattice cells; and
insert the copies of the modified lattice cells into corresponding subvolumes such that the faces of the modified lattice cell copies having face surfaces are positioned along non-adjoining sides of the subvolumes and the faces of the modified lattice cell copies not having face surfaces are positioned along adjoining sides of the subvolumes;

a non-transitory computer readable memory configured to store the data representative of the base lattice cell, the subvolumes, the modified lattice cells, and the modified lattice cell copies thereon;

a plurality of inputs for receiving inputs from a user; and a display configured to visually produce the base lattice cell, the subvolumes, the modified lattice cells, and the modified lattice cell copies for allowing the user to inspect and modify the united cellular lattice structure; and an additive manufacturing system configured to form the part via additive manufacturing material deposited layer by layer according to the united cellular lattice structure.

\* \* \* \* \*